(12) United States Patent
Li et al.

(10) Patent No.: US 8,256,499 B2
(45) Date of Patent: Sep. 4, 2012

(54) HEAT DISSIPATION DEVICE HAVING FAN HOLDER FOR ATTACHMENT OF A FAN

(75) Inventors: Min Li, Shenzhen (CN); Bi-Tao Wu, Shenzhen (CN)

(73) Assignees: Fu Zhun Precision Industry (Shen Zhen) Co., Ltd., Shenzhen, Guangdong Province (CN); Foxconn Technology Co., Ltd., Tu-Cheng, New Taipei (TW)

( * ) Notice: Subject to any disclaimer, the term of this patent is extended or adjusted under 35 U.S.C. 154(b) by 492 days.

(21) Appl. No.: 12/534,883

(22) Filed: Aug. 4, 2009

(65) Prior Publication Data

US 2010/0258272 A1    Oct. 14, 2010

(30) Foreign Application Priority Data

Apr. 8, 2009 (CN) .......................... 2009 1 0301384

(51) Int. Cl.
*F28F 7/00* (2006.01)
*H01L 23/467* (2006.01)
*H05K 5/00* (2006.01)

(52) U.S. Cl. .................. 165/80.3; 165/121; 361/697

(58) Field of Classification Search ............... 165/80.3, 165/121, 185; 361/695, 697, 704
See application file for complete search history.

(56) References Cited

U.S. PATENT DOCUMENTS

| 6,672,374 B1* | 1/2004 | Lin ............................. 165/121 |
| 7,178,587 B2* | 2/2007 | Liu ............................. 165/185 |
| 2006/0056152 A1* | 3/2006 | Li et al. ........................ 361/697 |
| 2007/0246189 A1* | 10/2007 | Lin et al. ...................... 165/80.3 |

* cited by examiner

*Primary Examiner* — Allen Flanigan
*Assistant Examiner* — Jason Thompson
(74) *Attorney, Agent, or Firm* — Altis Law Group, Inc.

(57) ABSTRACT

A heat dissipation device includes a heat sink, a fan and a holding frame securing the fan onto the heat sink. The holding frame is mounted on a top of the heat sink and has four beams located around the top of the heat sink and defines an opening in a central part thereof corresponding to the heat sink. The holding frame has two air-guiding plates extending inwardly and downwardly from two inner edges of two opposite beams to two opposite lateral sides of the heat sink. The fan is mounted on the holding frame and covers the opening and the two air-guiding plates of the holding frame.

12 Claims, 4 Drawing Sheets

HEAT DISSIPATION DEVICE HAVING FAN HOLDER FOR ATTACHMENT OF A FAN

BACKGROUND

1. Technical Field

The present invention relates generally to a heat dissipation device, and more particularly to a heat dissipation device incorporating a fan for dissipating heat generated by an electronic device, wherein, the heat dissipation device has a fan holder for attachment of the fan.

2. Description of Related Art

Generally, in order to ensure the normal running of an electronic device, a heat dissipation device is used to dissipate heat generated by the electronic device. A conventional heat dissipation device includes a heat sink and a fan attached on the heat sink to improve a heat-dissipation capacity of the heat sink.

When installing the fan to the heat sink, it is generally to fix the fan onto a top of the heat sink via a fan holder. Conventionally, the fan holder has a size similar to that of the heat sink and only capable of fixing a fan with an equal size to the heat sink. Therefore, an easy way to enhance a heat dissipation efficiency of the heat dissipation device is to replace the fan with a fan with higher rotate speed to provide the heat sink with an air flow of higher speed and air pressure, if the fan is mounted on the heat sink by the above conventional fan holder. However, as the rotate speed of the fan increasing, the fan would bring a harder vibration to the heat sink to cause more loudly unpleasing noise.

What is needed therefore is a heat dissipation device can obtain an improvement of the heat dissipation efficiency by a fan without inducing a worse noise.

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiments. Moreover, in the drawings, like reference numerals designate corresponding parts throughout the several views.

DETAILED DESCRIPTION

Figure 1:
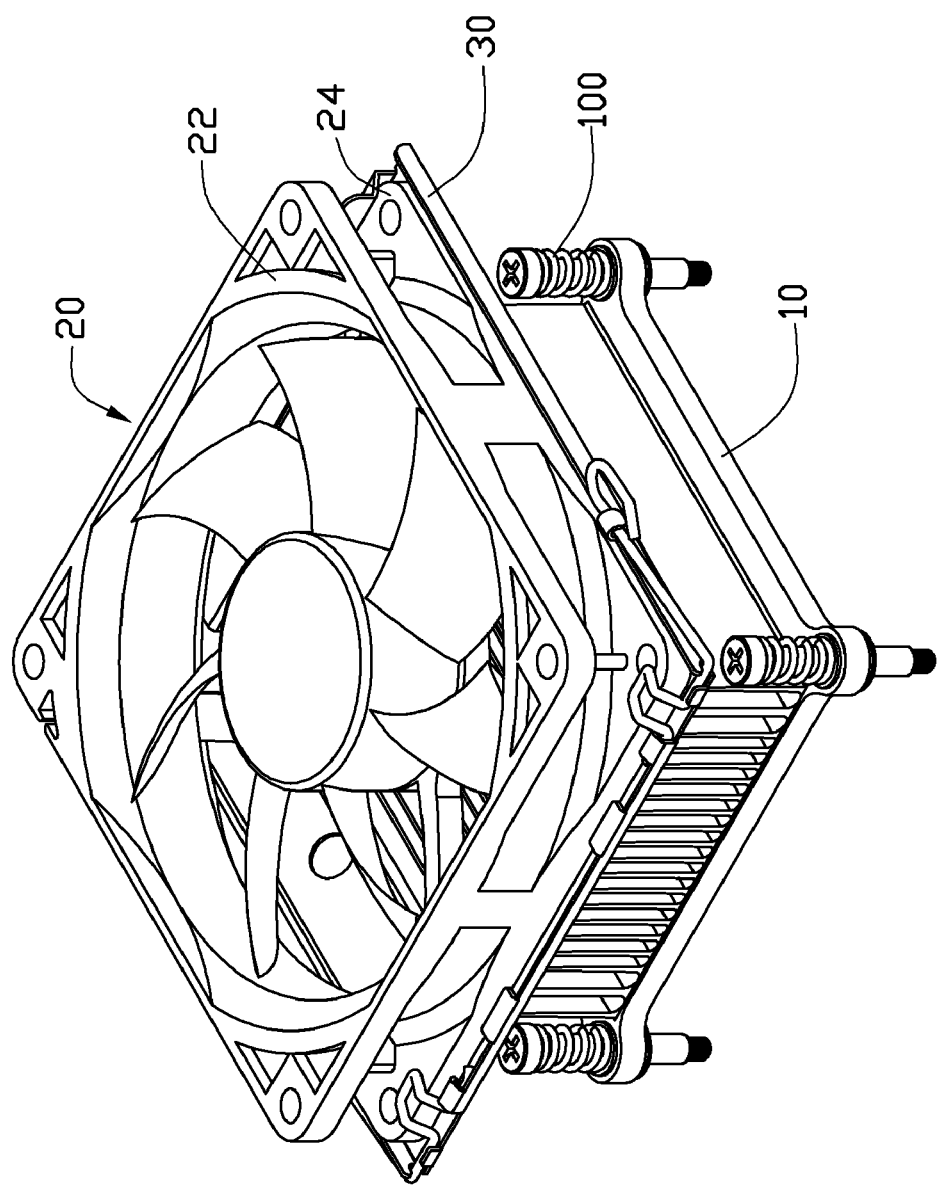
FIG. 1 is an isometric, assembled view of a heat dissipation device in accordance with an embodiment of the present disclosure.
Figure 2:
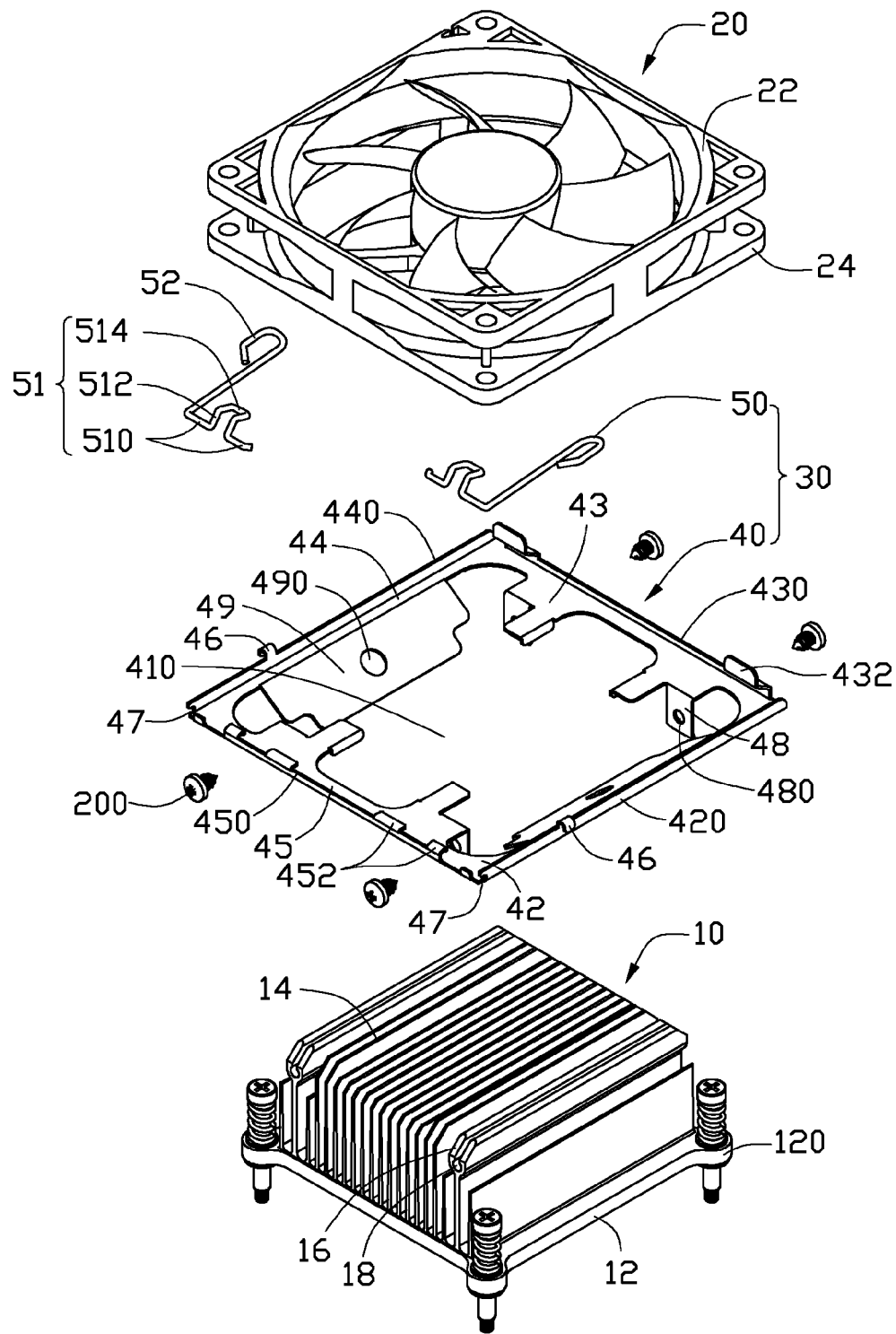
FIG. 2 is an exploded view of the heat dissipation device of FIG. 1.

FIGS. 1 and 2 illustrate a heat dissipation device in accordance with a preferred embodiment of the present invention. The heat dissipation device is provided for removing heat from a heat-generated electronic component (not shown). The heat dissipation device comprises a heat sink 10, a fan holder 30 secured on a top of the heat sink 10 and a fan 20 mounted on the heat sink 10 via the fan holder 30.

The heat sink 10 is integrally formed of a metallic material such as copper or aluminum and comprises a base 12 and a plurality of fins 14 extending upwardly from a top surface of the base 12. The base 12 is rectangular and has a flat bottom surface for contacting the heat-generated electronic component and four fixing ears 120 extending diagonally, outwardly from four corners thereof. Each of the fixing ears 120 therein defines a fixing hole (not labeled) which receives a fixture 100 for securing the heat dissipation device onto a printed circuit board (not shown) on which the heat-generated electronic component is mounted. The fins 14 are spaced from each other and perpendicular to the top surface and two opposite front and rear sides of the base 12. Two ones of the fins 14 respectively adjacent to two opposite lateral sides of the base 12 bifurcate at upper ends thereof and each have two branches 16 extending upwardly from two opposite side edges of the top end thereof. The two branches 16 are separated from and are parallel to each other. Two fixing holes 18 each are defined in a junction of the fin 14 adjacent to one of the two opposite lateral sides of the base 12 and the corresponding two branches 16 for engagingly receiving screws 200 to secure the fan holder 30 onto the heat sink 10. Top ends of the branches 16 are coplanar and cooperate with the other fins 14 to form a supporting face for supporting the fan holder 30 thereon.

The fan 20 has a size larger than that of the supporting face of the heat sink 10. It means that the fan 20 cover an area larger than an area of the top of the heat sink 10, whereby the fan 20 has some extended portions extending outwardly beyond a periphery of the top of the heat sink 10 when the fan 20 is mounted on the top of the heat sink 10. The fan 20 has a rectangular frame 22 with a size corresponding to that of the fan holder 30. Two separated fixing flanges 24 are formed at each corner of the frame 22 and parallel to each other. Lower ones of the fixing flanges 24 have bottom surfaces coplanar with a bottom surface of the frame 22.

The fan holder 30 comprises a holding frame 40 and two operating members 50 pivotally connected to the holding frame 40. The holding frame 40 is rectangular and has a size slightly larger than a size of the bottom surface of the fan 20 to fitly accommodate a lower portion of the fan 30 thereon. An opening 410 is defined in a center of the holding frame 40 for providing an air access from the fan 30 to the heat sink 10. In detail, the holding frame 40 comprises four beams 42, 43, 44, 45 at a periphery of the opening 410. The beam 42 is parallel to the beam 44 and is perpendicular to the beams 43, 45 which are parallel to each other. Four flanges 420, 430, 440, 450 extend upwardly from outer edges of the beams 42, 43, 44, 45 respectively to form a substantially rectangular space to accommodate the lower portion of the fan 20 therein. Two separated engaging members 48 extend downwardly from an inner edge of each of the two opposite beams 43, 45 to engage the two opposite ends of the junctions of the branches 16 and the fins 14 of the heat sink 10 adjacent to the two opposite lateral sides of the heat sink 10. Each engaging member 48 defines a piercing hole 480 therein for a corresponding screw 200 extending therethrough to be engagingly received in the fixing hole 18 to secure the holding frame 40 onto the heat sink 10. Two elastic flakes 432 are separated from each other and extended upwardly and inwardly from the flange 430 to engage upper surfaces of two neighboring lower fixing flanges 24 of the fan 20 to lock one side of the fan 20 onto the holding frame 40. Two pairs of restricting tabs 452 extend inwardly away from the flange 450 and are then bent downwardly to thereby define a receiving space (not labeled) between the tabs 452 and the holding frame 40 to pivotally receive and position the operating members 50. Each pair of the restricting tabs 452 are separated from each other and located adjacent to one end of the flange 450 of the beam 45. Two cutouts 47 are defined in two adjacent corners of the holding frame 40, respectively, and are located at two opposite ends of the beam 45. Two locking ears 46 extend upwardly from the two opposite beams 42, 44 and are curved outwardly and backwardly to thus have a C-shaped configuration. The two locking ears 46 are located adjacent to the beam 45.

Two air-guiding members are provided by the holding frame 40 to be located between two opposite outer sides of the heat sink 10 and two inner edges of the two opposite beams 42, 44 of the holding frame 40 for guiding an air flow generated by the fan 20 to the heat sink 20. The two air guiding members includes two air-guiding plates 49 extending downwardly and inwardly from two facing inner edges of the two opposite beams 42, 44. The two air-guiding plates 49 are extended obliquely toward each other from the two facing inner edges of the beams 42, 44 to reach two respective outer sides of the two junctions of the fins 14 and the branches 16. A through hole 490 is defined in a center of each air-guiding plate 49 for the air flow passing downwardly therethrough to the fins 14 located outside the two fins 14 having the branches 16.

Each operating member 50 is formed by bending an elastic metallic wire and has a substantially L-shaped configuration. Each operating member 50 comprises a pivot shaft 51 and a handle 52 extending perpendicularly from one end of the pivot shaft 51. The pivot shaft 51 comprises two separated pivot sections 510 substantially in line with each other to define a pivoting axis, two connecting sections 512 extending perpendicularly from two respective adjacent ends of the pivot sections 510 and a U-shaped pressing section 514 formed at top ends of the two connecting sections 512. The U-shaped pressing section 514 is at an obtuse angle to the connecting sections 512, and has a middle portion offsetting from the pivot sections 510. The handle 52 is angled to the holding frame 40 and the connecting sections 512 when the pivot sections 510 of the operating member 50 are pivotally positioned between the tabs 452 and the holding frame 40 (clearly seen in FIG. 3). A free end of the handle 52 is folded back for facilitating an operation of the operating member 50.

Figure 3:
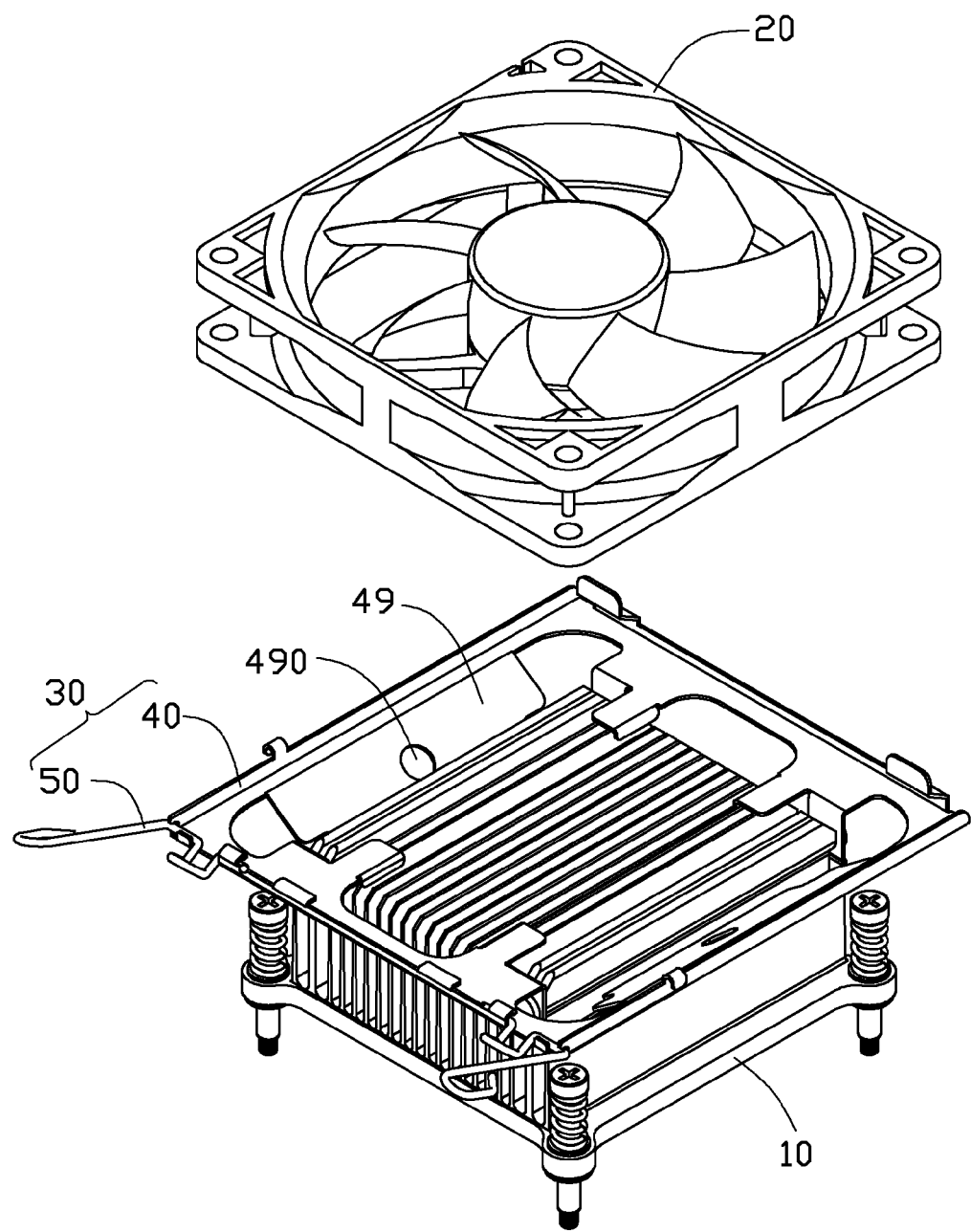
FIG. 3 is a partially assembled view of the heat dissipation device of FIG. 1, with a fan separated therefrom.
Figure 4:
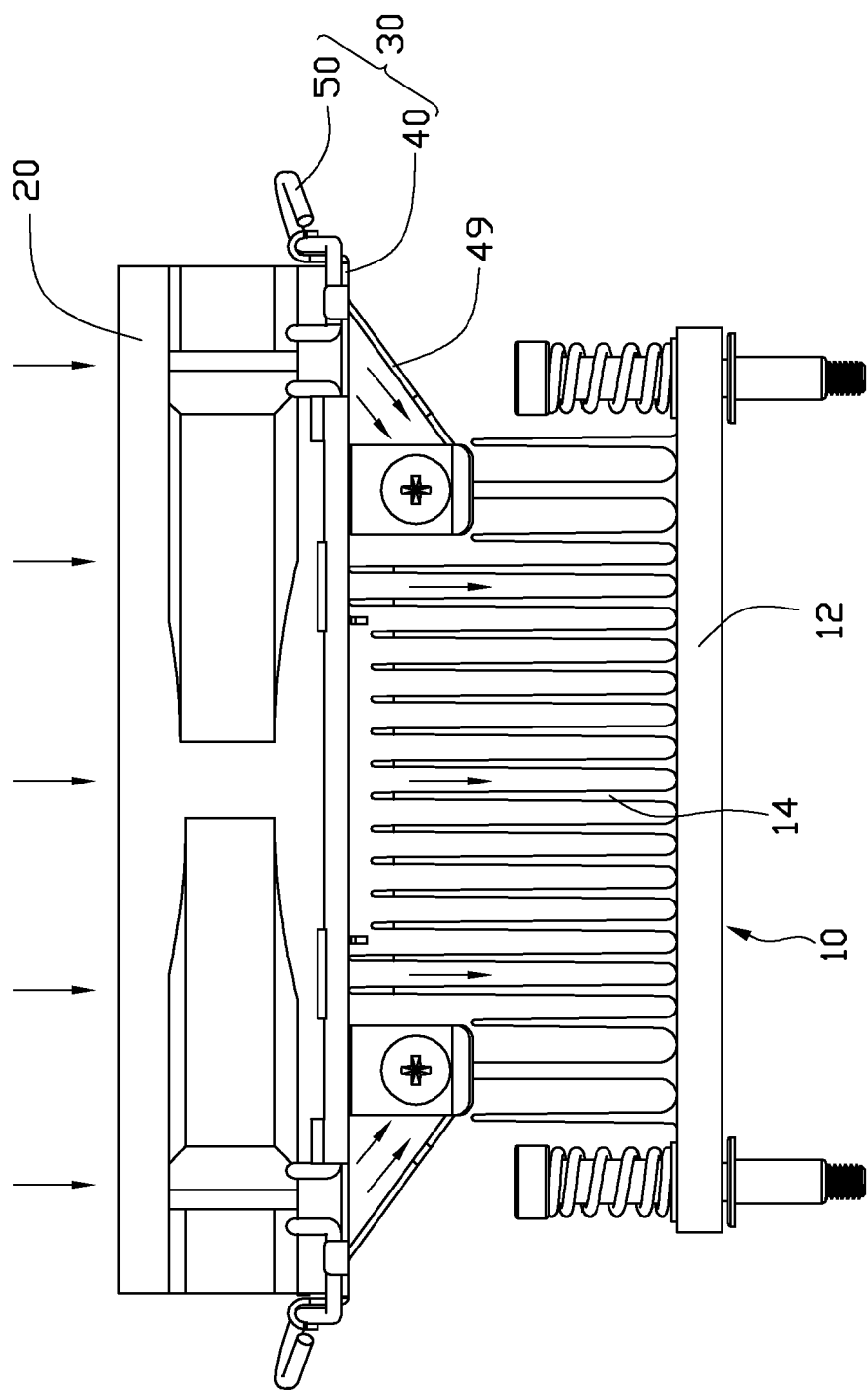
FIG. 4 is a front, elevational view of the heat dissipation device of FIG. 1 in a locked state.

Referring particularly to FIGS. 3 and 4, in assembly of the fan holder 30, the pivot sections 510 of each operating member 50 are lodged in the receiving space between the tabs 452 and the holding frame 40. Each cutout 47 receives a joint of the operating member 50 between the handle 52 and the pivot section 510. Thus, the operating members 50 are pivotally assembled to the holding frame 40. As shown in FIG. 3, the handles 52 are disposed beyond the flanges 420, 440 and can rotate around the axes formed by the pivot sections 510 from an unlocked position to a locked position. When operating members 50 are in the unlocking position, the handles 52 are angled to the holding frame 40 and the U-shaped pressing sections 514 are away from the frame 22 of the fan 20. When the operating members 50 are in the locking position, as shown in FIGS. 1 and 4, the handles 52 are parallel to the holding frame 40 and are locked under the corresponding locking ears 46 and the pressing sections 514 are firmly pressed on the top surfaces of the other two neighboring lower engaging flanges 24 of the frame 22 of the fan 20.

In operation, the fan holder 30 is placed on the top of the heat sink 10 and surrounds an upper portion of the heat sink 10. The four beams 42, 43, 44, 45 are located round a periphery of the top of the heat sink 10. The screws 200 are then extended through the piercing holes 480 of the engaging members 48 of the holding frame 40 and screwed into the fixing holes 18 at the two opposite lateral sides of the heat sink 10 to thus secure the fan holder 30 on the heat sink 10. Initially, the handles 52 are located at the unlocked position before the fan 20 is placed on the holding frame 40. The fan 20 is placed on top of the holding frame 40 with the two elastic flakes 432 abutting downwardly against the two neighboring lower engaging flanges 24 of the fan 20. Then, the handles 52 are rotated with respect to the axes of the pivot shafts 51 to cause the pressing sections 514 to move toward the other two neighboring lower engaging flanges 24 of the fan 20. When the angle between the handles 52 and the holding frame 40 changes to about 45 degrees, the pressing sections 514 reach top surfaces of the other two neighboring lower engaging flanges 24 of the fan 20. The handles 52 are further rotated to be hitched by the corresponding locking ears 46, while the pressing sections 514 press the other two neighboring lower neighboring flanges 24 of the fan 20 toward the holding frame 40 to thus firmly secure the fan 20 onto the heat sink 10.

To detach the fan 20 from the fan holder 30, the handles 52 are detached from the locking ears 46 and rotated with respect to the axes of the pivot shafts 51 to cause the pressing sections 514 to move away from the fan 20. The fan 20 thus can be removed directly away from the holding frame 40.

It is understood that, the user is not limited by the sequence of installation and uninstall of the heat dissipation device described in the above embodiment. For example, the user can firstly assemble the fan 30 and the fan holder 20 together, and then fix the fan holder 20 with the fan 30 to the heat sink 10 to finish the installation.

In use, the fan 20 having a larger size than the heat sink 10 is capable of providing the heat sink 10 with adequate air flow in a low rotate speed to enhance a heat dissipating efficiency of the heat dissipation device. As the fan 20 rotates with a low speed, it would not cause a large vibration to make an unbearable large noise.

It is believed that the present embodiments and their advantages will be understood from the foregoing description, and it will be apparent that various changes may be made thereto without departing from the spirit and scope of the disclosure or sacrificing all of its material advantages, the examples hereinbefore described merely being preferred or exemplary embodiments of the disclosure.

What is claimed is:

1. A heat dissipation device comprising:
   a heat sink;
   a holding frame mounted on a top of the heat sink, the holding frame having four beams located around the top of the heat sink and defining an opening in a central part thereof corresponding to the heat sink, and having two air-guiding plates extending inwardly and downwardly from two inner edges of two opposite beams to two opposite lateral sides of the heat sink; and
   a fan mounted on the holding frame and covering the opening and the two air-guiding plates of the holding frame;
   wherein the heat sink comprises a base and a plurality of fins extending upwardly from the base, two inner edges of the two air-guiding plates respectively engage two outer lateral sides of two fins adjacent to two lateral sides of the base; and
   wherein each air-guiding plate defines a through hole therein.

2. The heat dissipation device as claimed in claim 1, wherein another two opposite beams of the four beams each comprise two engaging members that extend downwardly from an inner edge of said corresponding beams and respectively engage with the two fins.

3. The heat dissipation device as claimed in claim 2, wherein the two fins bifurcate at upper ends thereof and each have two separated branches extending upwardly from two opposite side edges of the top end thereof, two fixing holes are defined in two opposite ends of a junction of the fin and the corresponding two branches for engagingly receiving screws extended through the corresponding engaging members of the holding frame.

4. The heat dissipation device as claimed in claim 1, wherein four flanges extend upwardly from edges of the four beams and cooperate with each other to receive a lower portion of the fan therein.

5. The heat dissipation device as claimed in claim 4, wherein two separated elastic flakes extend upwardly and inwardly from the flange to engage the fan to lock one side of the fan on the holding frame.

6. The heat dissipation device as claimed in claim 5, further comprising two operating members pivotally mounted to the holding frame and engaging the fan to lock another side of the fan onto the holding frame.

7. The heat dissipation device as claimed in claim 6, wherein the fan having two separated engaging flanges at each corner thereof, the two elastic flakes press on two neighboring lower engaging flanges while the operating members pressing on another two neighboring lower engaging flanges.

8. The heat dissipation device as claimed in claim 7, wherein each operating member comprises a pivot shaft and a handle extending perpendicular from an end of the pivot shaft, the pivot shaft comprising two separated pivot sections pivotally connected to the holding frame, two connecting members extending from two respective adjacent ends of the pivot sections and a pressing section formed at top ends of the two connecting sections and pressing on the another neighboring engaging flanges of the fan.

9. The heat dissipation device as claimed in claim 8, wherein the flange of the beam opposite to the elastic flakes have two pair of restricting tabs extending inwardly away from the flange and are then bent downwardly to thereby define a receiving space pivotally receiving the pivot sections of the corresponding operating member.

10. The heat dissipation device as claimed in claim 9, wherein two locking ears are extended upwardly respectively from the two opposite flanges and curved back to thus have a C-shaped configuration to catch the handle of the operating member.

11. The heat dissipation device as claimed in claim 9, wherein two cutouts are defined in two neighboring corners of the holding frame at two opposite ends of the flange opposite to the elastic flakes and each cutout receive a conjunction of the operating member between the handle and the pivot section when the handles are rotated away from the holding frame to bring the pressing sections away from the fan.

12. A heat dissipation device comprising:
a heat sink;
a holding frame mounted on a top of the heat sink, the holding frame having four beams located around the top of the heat sink and defining an opening in a central part thereof corresponding to the heat sink, and having two air-guiding plates extending inwardly and downwardly from two inner edges of two opposite beams to two opposite lateral sides of the heat sink; and
a fan mounted on the holding frame and covering the opening and the two air-guiding plates of the holding frame;
wherein each air-guiding plate defines a through hole therein.

\* \* \* \* \*